United States Patent [19]
Huang et al.

[11] Patent Number: 5,202,593
[45] Date of Patent: Apr. 13, 1993

[54] BI-DIRECTIONAL BUS REPEATER

[75] Inventors: Thomas B. Huang, San Jose, Calif.;
Yih-Chyun Jenq, Lake Oswego;
Keith Lofstrom, Hillsboro, both of Oreg.

[73] Assignees: I-Cube Design Systems Inc., Santa Clara; PiE Design Systems Inc., Sunnyvale, both of Calif.

[21] Appl. No.: 785,299

[22] Filed: Oct. 30, 1991

[51] Int. Cl.$^5$ .................. H03K 17/0175; H03K 17/16
[52] U.S. Cl. .................................. 307/475; 370/85.1; 307/270; 307/443
[58] Field of Search ........................ 307/270, 475, 443; 365/200, 900; 395/200, 700, 800; 370/85; 340/825.05, 825.06, 825.07

[56] References Cited

U.S. PATENT DOCUMENTS

| | | | |
|---|---|---|---|
| 4,161,786 | 7/1979 | Hopkins et al. | 370/85.7 |
| 4,604,689 | 8/1986 | Burger | 364/200 |
| 4,768,188 | 8/1988 | Barnhart et al. | 370/95.3 |
| 4,837,788 | 6/1989 | Bird | 370/97 |
| 4,974,153 | 11/1990 | Pimm et al. | 364/200 |
| 5,036,473 | 7/1991 | Butts et al. | 364/489 |

*Primary Examiner*—Edward P. Westin
*Assistant Examiner*—Andrew Sanders
*Attorney, Agent, or Firm*—Dellett, Smith-Hill and Bedell

[57] ABSTRACT

A bi-directional bus repeater includes two unidirectional bus repeaters connected for retransmitting signals in opposite directions between two buses. When an external bus driver pulls either bus low, one of the unidirectional bus repeaters pulls the other bus low. When the external bus driver allows the bus to rise to the high logic level, the unidirectional bus repeater temporarily supplies a high charging current to the other bus to quickly pull it up. Each unidirectional bus repeater also generates signals indicating when it is actively pulling its output bus up or down and the indicating signals inhibit one unidirectional bus repeater from actively driving its output when the other unidirectional bus repeater is actively driving its output.

7 Claims, 1 Drawing Sheet

BI-DIRECTIONAL BUS REPEATER

CROSS REFERENCE TO RELATED APPLICATIONS

The bi-directional bus repeater described and claimed herein is also described in co-pending U.S. patent application Ser. No. 785,082 entitled "Field Programmable Circuit Board" filed concurrently herewith, as well as in co-pending U.S. patent application Ser. No. 784,901 entitled "Field Programmable Interconnect Device" filed concurrently herewith.

BACKGROUND OF THE INVENTION

A bus repeater receives a logic signal on one bus and retransmits it on another. A unidirectional bus repeater transmits a logic signal in only one direction from a "master" bus to a "slave" bus while a bi-directional bus repeater can transmit logic signals in either direction between two buses. Bi-directional bus repeaters of the prior art require a control signal input indicating the direction the logic signal is to be transmitted. That is, the control signal indicates at any given moment which of the two buses is to transmit a logic signal and which bus is to receive it.

However, in some applications such a control signal may not be available and a bi-directional bus repeater that transmits signals between two buses in either direction without need for a direction indicating control signal input would be of advantage.

SUMMARY OF THE INVENTION

In accordance with one aspect of the invention, a bi-directional bus repeater includes two unidirectional bus repeaters connected for retransmitting logic signals in opposite directions between two buses. In a quiescent state when no external bus drivers are actively pulling down on the buses, small trickle currents supplied by the bus repeaters pull their output buses up to a high logic level. When an external bus driver connected to either of the buses pulls that bus low, one of the unidirectional bus repeaters pulls the other bus low. When the external bus driver releases the bus, allowing the bus to rise to a high logic state, the unidirectional bus repeater that was holding the other bus low responds by temporarily supplying a high charging current to the other bus to pull it quickly back up to the high logic level. Thereafter the trickle currents continue to hold the other bus high.

Each unidirectional bus repeater also generates PULL UP and PULL DOWN signals indicating when the bus repeater is actively pulling up or down on a bus and the indicating signals produced by each unidirectional bus repeater are supplied as inputs to the other unidirectional bus repeater. The indicating signal input inhibits one unidirectional bus repeater from actively driving its output bus up or down when the other bus repeater is actively driving its output bus up or down. Thus the first unidirectional bus repeater to sense its input has been pulled down pulls down its output and inhibits the remaining unidirectional bus repeater from actively driving its output. The first unidirectional bus repeater continues to inhibit the other until the first unidirectional bus repeater has stopped driving its output bus.

It is accordingly an object of the invention to provide an improved bi-directional bus repeater that automatically retransmits signals in both directions between two buses without need of an externally generated control signal for indicating the signal transmission direction.

The concluding portion of this specification particularly points out and distinctly claims the subject matter of the present invention. However, those skilled in the art will best understand both the organization and method of operation of the invention, together with further advantages and objects thereof, by reading the following description in view of the accompanying drawings wherein like reference characters refer to like elements.

DESCRIPTION OF THE PREFERRED EMBODIMENT

Figure 1:
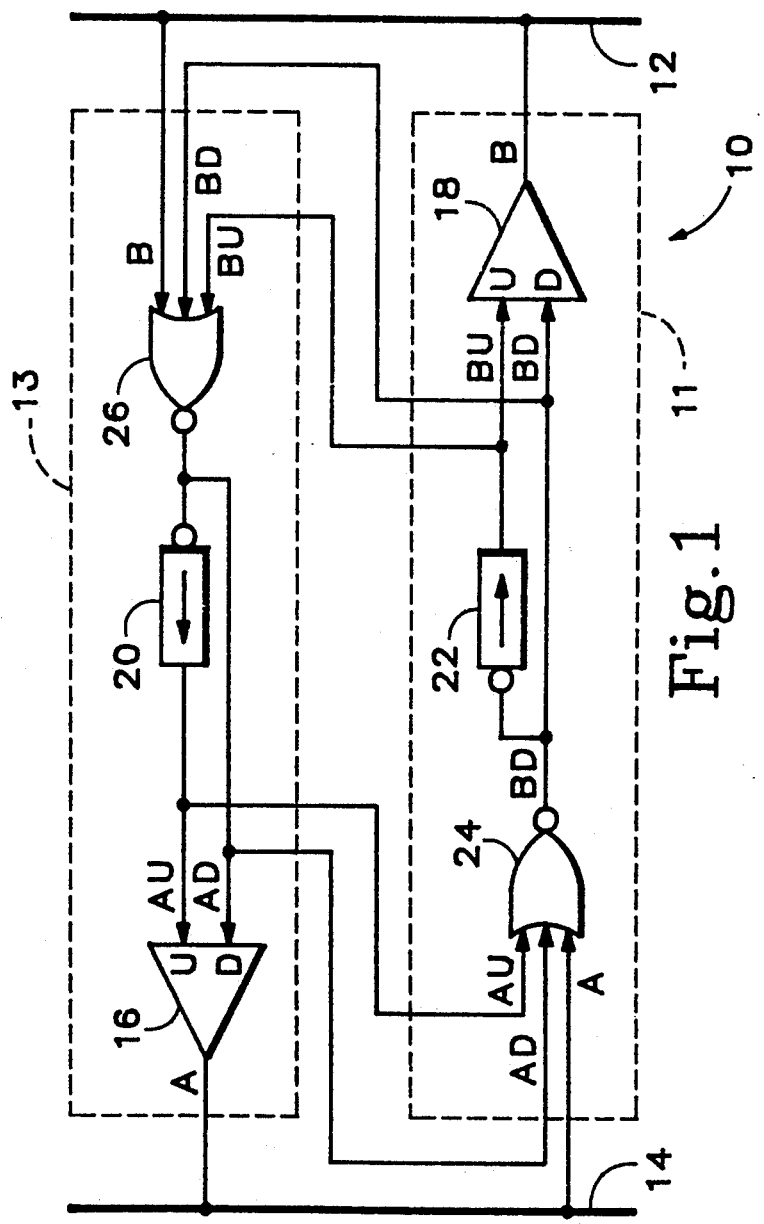
FIG. 1 is a block diagram of a bi-directional bus repeater in accordance with the present invention.

FIG. 1 illustrates a bi-directional bus repeater 10 in block diagram form. Bi-directional bus repeater 10 includes two unidirectional bus repeaters 11 and 13 connected for retransmitting logic signals in opposite directions between two buses 12 and 14. When neither bus 12 nor bus 14 is pulled to a low logic level by an external bus driver (not shown), small trickle currents pull both buses up to a high logic level. When the external bus driver asserts the logic signal A or B on either bus 12 or 14 by pulling the bus low, one of the unidirectional bus repeaters 11 or 13 asserts the other signal B or A on the other bus 14 or 12 by pulling that bus low. When the external bus driver allows the bus to rise again to the high logic level, the unidirectional bus repeater 11 or 13 holding the other bus down temporarily supplies a high charging current to the other bus 12, 14 to quickly pull it up. The trickle current holds the bus up thereafter.

Each unidirectional bus repeater 11, 13 also asserts signals AU and AD, or BU and BD indicating when it is actively pulling its output bus 12 or 14 up or down. These indicating signals inhibit the other unidirectional bus repeater from actively driving its output bus up or down. Thus each unidirectional bus repeater 11 or 13 operates independently to pull its output bus down when it detects the signal on its input bus has been pulled down, but only one unidirectional bus repeater can actively drive its output bus at any given moment. The first unidirectional bus repeater to respond to a low level input signal by pulling its output bus low blocks the other from responding to its input signal until the first unidirectional bus repeater no longer detects a low level input signal.

Unidirectional bus repeater 11, in a preferred embodiment thereof, includes a buffer 18, a three-input NOR gate 24 and a single-shot device 22. Buffer 18 drives bus 12 carrying logic signal B. NOR gate 24 produces an indicating signal BD telling buffer 18 when to pull down signal B on its output bus 12. The single-shot device 22, triggered by the falling edge of pull down indicating signal BD, generates indicating signal BU telling buffer 18 when to actively pull up bus 12. Bus 14 logic signal A drives one NOR gate 24 input while pull up and pull down indicating signals AU and AD produced by the other unidirectional bus repeater 13 control the other NOR gate 24 inputs.

Unidirectional bus repeater 13 includes a buffer 16, a three-input NOR gate 26 and a single-shot device 20.

Buffer 16 drives bus 14 carrying logic signal A. NOR gate 26 produces the AD indicating signal informing buffer 16 when to pull down signal A on its output bus 14. The single-shot device 20, triggered by the falling edge of the pull down indicating signal AD, generates indicating signal AU informing buffer 16 when to actively pull up bus 14. Bus 12 signal B drives one NOR gate 26 input while the pull up and pull down indicating signals BU and BD produced by the other unidirectional bus repeater 11 drive the other NOR gate 26 inputs.

In a quiescent state, when neither bus 12 nor bus 14 is externally driven, trickle currents in buffers 16 and 18 hold both the A and B logic signals high. NOR gates 24 and 26 hold indicating signals AD and BD low and single-shot devices 20 and 22 hold indicating signals AU and BU low. Thus neither buffer 16 nor buffer 18 actively drives its output buffer.

When an external bus driver (not shown) pulls down signal A on bus 14, NOR GATE 24 asserts indicating signal BD thereby causing buffer 18 to pull down logic signal B. When the external bus driver pulls logic signal A on bus 14 high, or releases bus 14 allowing a trickle current in buffer 16 to pull up logic signal A, NOR gate 24 responds by pulling signal BD down. However, NOR gate 24 does so only when signals AU and AD are both low, indicating that buffer 18 is not actively driving bus 12. The falling edge of indicating signal BD causes single-shot device 22 to pulse signal BU high, thereby causing buffer 18 to quickly pull up B. Thereafter a trickle current in buffer 18 continues to hold B up.

When an external bus driver (not shown) pulls signal B on bus 12 low, NOR gate 26 pulls up indicating signal AD, provided signals BU and BD are both low. The rising signal AD causes buffer 16 to pull down logic signal A. When the external bus driver pulls signal B high or releases bus 12 allowing a trickle current in buffer 18 to pull logic signal B back up, NOR gate 26 responds by pulling signal AD down, provided indicating signals AU and AD are low. The falling edge of signal AD causes single-shot device 20 to pulse indicating signal AU high. Buffer 16 then quickly pulls up logic signal A. Thereafter a trickle current in buffer 16 continues to hold logic signal A up if not otherwise driven high by an external driver connected to bus 14.

Figure 2:
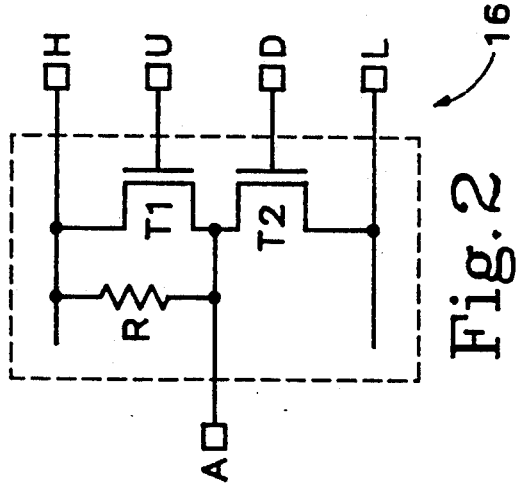
FIG. 2 illustrates in schematic diagram form a preferred embodiment of buffer 16 of FIG. 1.

FIG. 2 illustrates a preferred embodiment of buffer 16 of FIG. 1 in schematic diagram form. (Buffer 18 of FIG. 1 corresponds to buffer 16.) Buffer 16 comprises transistors T1 and T2 and a resistor R. One load terminal of transistor T1 is connected to a high logic level source H and one load terminal of transistor T2 is connected to a low logic level source L while the other load terminals of transistors T1 and T2 are tied together to produce output A. The control terminal of transistor T1 receives the U input of buffer 16 and the control terminal of transistor T2 receives the D input of buffer 16. Resistor R is connected between source H and output A.

When input signal U is high and input signal D is low, transistor T1 is on and transistor T2 is off and source H pulls output signal A up. When input signal D is high and input signal H is low, transistor T2 is on and transistor T1 is off and source L pulls output signal A down. When both input signals U and D are low, source H pulls output A up via a small trickle current through resistor R, unless signal A is pulled down by an external buffer.

There has thus been described a bi-directional bus repeater including two unidirectional bus repeaters connected for retransmitting signals in opposite directions between two buses. Each unidirectional bus repeater is adapted to actively drive a separate one of the buses. Each unidirectional bus repeater also generates signals indicating when it is actively pulling its output bus up or down and the indicating signals inhibit one unidirectional bus repeater from actively driving its output when the other unidirectional bus repeater is actively driving its output. No externally generated direction indicating control signals are required.

While the foregoing specification has described a preferred embodiment of the present invention, one skilled in the art may make many modifications to the preferred embodiment without departing from the invention in its broader aspects. The appended claims therefore cover all such modifications as fall with the true spirit of the invention.

We claim:

1. A bi-directional bus repeater for transmitting signals between first and second buses comprising:

first unidirectional bus repeater means, connected for receiving a first logic signal carried on said first bus and at least one first indicating signal, for generating a second logic signal on said second bus when said first logic signal is asserted and said first indicating signal is not asserted, and for asserting at least one second indicating signal when generating said second logic signal; and second unidirectional bus repeater means, connected for receiving said second logic signal and said at least one second indicating signal, for generating said first logic signal when said second logic signal is asserted and said second indicating signal is not asserted, and for asserting said at least one first indicating signal when generating said first logic signal.

2. The bi-directional bus repeater in accordance with claim 1 wherein said first unidirectional bus repeater means comprises:

buffer means, connected for receiving PULL UP and PULL DOWN signals, for driving said second logic signal to a high logic state upon assertion of said PULL UP indicating signal and for driving said second logic signal to a low logic level in response to assertion of said PULL DOWN signal, said PULL UP and PULL DOWN signals comprising said at least one second indicating signal;

logic gate means, connected for receiving said first logic signal and said at least one first indicating signal, for asserting and deasserting said PULL DOWN signal in response to logical combinations of states of said first logic signal and said at least one first indicating signal; and single-shot means, connected for receiving said PULL DOWN signal, for temporarily asserting said PULL UP signal when said PULL DOWN signal is deasserted.

3. The bi-directional bus repeater in accordance with claim 1 wherein said logic gate means comprises a NOR gate.

4. The bi-directional bus repeater in accordance with claim 2 wherein said buffer means comprises:

a source of high logic level, a source of low logic level, a first transistor having load terminals connected between said source of high logic level and said second bus, and a control terminal receiving said PULL UP signal, and a second transistor having load terminals connected between said source of low logic level and said second bus, and a control terminal receiving said PULL DOWN signal.

5. The bi-directional bus repeater in accordance with claim 4 wherein said buffer means further comprises a resistor connected between said source of high logic level and said second bus.

6. A bi-directional bus repeater for transmitting signals between first and second buses comprising:

first unidirectional bus repeater means, connected for receiving a first logic signal carried on said first bus and at least one first indicating signal, for generating a second logic signal on said second bus when said first logic signal is asserted and said first indicating signal is not asserted, and for asserting at least one second indicating signal when generating said second logic signal; and second unidirectional bus repeater means, connected for receiving said second logic signal and said at least one second indicating signal, for generating said first logic signal when said second logic signal is asserted and said second indicating signal is not asserted, and for asserting said at least one first indicating signal when generating said first logic signal;

wherein said first unidirectional bus repeater means comprises:

buffer means, connected for receiving PULL UP and PULL DOWN signals, for driving said second logic signal to a high logic state upon assertion of said PULL UP indicating signal and for driving said second logic signal to a low logic level in response to assertion of said PULL DOWN signal, said PULL UP and PULL DOWN signals comprising said at least one second indicating signal;

a NOR gate, connected for receiving said first logic signal and said at least one first indicating signal, for asserting and deasserting said PULL DOWN signal in response to logical combinations of states of said first logic signal and said at least one first indicating signal; and single-shot means, connected for receiving said PULL DOWN signal, for temporarily asserting said PULL UP signal when said PULL DOWN signal is deasserted;

wherein said buffer means comprises:
a source of high logic level,
a source of low logic level,
a first transistor having load terminals connected between said source of high logic level and said second bus and a control terminal receiving said PULL UP signal, and
a second transistor having load terminals connected between said source of low logic level and said second bus and a control terminal receiving said PULL DOWN signal.

7. The bi-directional bus repeater in accordance with claim 6 wherein said buffer means further comprises a resistor connected between said source of high logic level and said second bus.

* * * * *